United States Patent
Shigeta et al.

(10) Patent No.: US 7,126,308 B2
(45) Date of Patent: Oct. 24, 2006

(54) INTERFACE CIRCUIT WITH POWER CONVERTER WITH INTERFACE CIRCUIT AND ELECTRIC VEHICLE WITH POWER CONVERTER

(75) Inventors: Satoru Shigeta, Hitachinaka (JP); Yuuji Maeda, Hitachiota (JP); Junichi Sakano, Hitachi (JP); Shinji Shirakawa, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 243 days.

(21) Appl. No.: 10/715,379

(22) Filed: Nov. 19, 2003

(65) Prior Publication Data

US 2004/0100750 A1 May 27, 2004

(30) Foreign Application Priority Data

Nov. 20, 2002 (JP) .............................. 2002-336098

(51) Int. Cl.
*H02P 27/04* (2006.01)
(52) U.S. Cl. ...................... 318/802; 361/118; 330/278; 330/285; 330/302; 330/306
(58) Field of Classification Search ...................... None
See application file for complete search history.

(56) References Cited

U.S. PATENT DOCUMENTS

| | | | |
|---|---|---|---|
| 5,126,593 A | 6/1992 | Mahler | |
| 5,424,666 A | 6/1995 | Palara et al. | |
| 5,489,861 A | 2/1996 | Seymour | |
| 6,127,876 A | 10/2000 | Soltero | |
| 6,329,785 B1 * | 12/2001 | Starkie et al. | 318/811 |
| 6,504,937 B1 * | 1/2003 | Papadopoulos et al. | 381/113 |
| 6,628,170 B1 * | 9/2003 | Titus | 330/278 |
| 2004/0100233 A1 * | 5/2004 | Ouyang et al. | 323/272 |
| 2004/0207471 A1 * | 10/2004 | Raja et al. | 330/285 |

FOREIGN PATENT DOCUMENTS

| | | |
|---|---|---|
| DE | 22 05 968 | 8/1973 |
| GB | 1 572 094 | 7/1980 |
| JP | 07-184367 | 7/1995 |
| JP | 08-242590 | 9/1996 |
| JP | 2000-341974 | 12/2000 |
| JP | 2001-327171 | 11/2001 |
| NR | 332 483 | 10/1975 |

OTHER PUBLICATIONS

Japanese Office Action dated Nov. 1, 2005.

\* cited by examiner

*Primary Examiner*—Lincoln Donovan
*Assistant Examiner*—Erick Glass
(74) *Attorney, Agent, or Firm*—Crowell & Moring LLP

(57) ABSTRACT

In order to provide an interface circuit, a power converter using the same and an electric vehicle using the same, wherein this interface circuit ensures improved control reliability without employing a photo-coupler, an interface circuit 100A transfers control signals to the power transistor in a large-current circuit 300 from a small-signal circuit 200 for driving a power transistor. The interface circuit 100A has a noise absorber 120 that electrically absorbs a noise voltage produced between the ground of the small-signal circuit 200 and that of the power transistor. The noise absorber 120 transfers to the power transistor the control signals generated by the small-signal circuit 200, without being affected by the noise voltage if produced.

17 Claims, 6 Drawing Sheets

INTERFACE CIRCUIT WITH POWER CONVERTER WITH INTERFACE CIRCUIT AND ELECTRIC VEHICLE WITH POWER CONVERTER

BACKGROUND OF THE INVENTION

The present invention relates to an interface circuit, a power converter using the same and an electric vehicle using the same, particularly to an interface circuit preferably used to control a power transistor, a power converter using the same, and an electric vehicle using the same.

In a conventional motor load drive system, an interface circuit comprising a photo-coupler is arranged between the control unit as a circuit for a control system and a power semiconductor. To put it another way, since the power semiconductor for driving the motor as a load causes large current to be switched in a short time, the voltage occurring to stray inductance changes the potential of the ground of a large-current circuit, with the result that noise is produced. Accordingly, wiring for large-current circuit ground and that for small-signal circuit ground are provided. To avoid an operation error caused by noise due to stray inductance, control signals are transferred from the small-signal circuit to the large-current circuit through a photo-coupler, thereby allowing the small-signal circuit and large-current circuit to be separated electrically.

Patent Document as a prior art stated as above may be cited as follows, for example;

Japanese Application Patent Laid-Open Publication No. 2001-327171

However, since the photo-coupler uses an optical device, there has been a problem of low durability and hence poor reliability. Especially in an electric vehicle where wheels are driven by a motor, even though the working temperature environment is found in such a wide range as −40 through +105 degrees Celsius, the usable temperature range of the photo-coupler is smaller than that, and durability is much reduced in low or high temperature. When the photo-coupler has broken and control signals cannot be transferred to the large-current circuit from the small-signal circuit, the motor control will be disabled and the electric vehicle cannot be driven any more, with the result that reliability for control is reduced.

On the other hand, if the power converter is not used, control signals cannot be supplied correctly to the power transistor due to noise caused by the aforementioned stray inductance.

The object of the present invention is to provide an interface circuit characterized by improved control reliability without a photo-coupler, a power converter using the same, and an electric vehicle using the same.

SUMMARY OF THE INVENTION (1) To achieve the aforementioned object, the present invention provides an interface circuit for transferring a control signal from a small-signal circuit for driving a power transistor to the aforementioned power transistor, the aforementioned interface circuit comprising a noise absorber for electrically absorbing noise voltage produced between the ground of the aforementioned small-signal circuit and that of the aforementioned power transistor. This interface circuit is further characterized in that the aforementioned noise absorber ensures that the aforementioned control signal produced by the aforementioned small-signal circuit is transferred to the aforementioned power transistor, without being affected by the aforementioned noise voltage if produced.

Such a configuration ensures control reliability to be improved without using a photo-coupler.

(2) It is preferred that the interface circuit according to the aforementioned item (1) be characterized in that the aforementioned noise absorber comprises a constant voltage dead band generator that does not allow current to flow until a certain voltage is reached, or a constant current dead band generator that allows constant current to flow until a certain voltage is reached, wherein this dead band electrically absorbs the influence of the aforementioned noise voltage.

(3) It is preferred that the interface circuit according to the aforementioned item (2) be characterized in that the aforementioned noise absorber further comprises, in addition to the aforementioned constant voltage dead band, a low signal generator for generating the low signal corresponding to the low level of the aforementioned control signal; and a high signal generator for generating a high signal corresponding to the high level of the aforementioned control signal.

(4) It is preferred that the interface circuit according to the aforementioned item (3) be characterized in that the aforementioned dead band voltage Vc of the aforementioned constant voltage dead band is set at a level higher than the aforementioned noise voltage Vnoise.

(5) It is preferred that the interface circuit according to the aforementioned item (2) be characterized in that the aforementioned noise absorber further comprises, in addition to the aforementioned constant current dead band, a current/voltage converting circuit that generates a high signal by converting constant current into voltage when the aforementioned constant current is allowed to flow by the aforementioned constant current dead band.

(6) It is preferred that the interface circuit according to the aforementioned item (1) be characterized by further comprising a signal amplifier that converts the control signal outputted by the aforementioned noise absorber, into the signal level for turning on or off the aforementioned power transistor.

(7) It is preferred that the interface circuit according to the aforementioned item (6) be characterized in that the difference between power voltage VDC and logic voltage amplitude .Vlogic of the aforementioned signal amplifier (VDC−.Vlogic) is set at a level higher than the aforementioned noise voltage Vnoise.

(8) To achieve the aforementioned object, the present invention provides an interface circuit for transferring to the module containing a semiconductor device the control signal for driving the aforementioned semiconductor device outputted from a controller. This interface circuit comprises:

receiving means for electrically receiving the aforementioned control signal outputted from the aforementioned controller; and transferring means for transferring to the aforementioned module the aforementioned control signal received by the aforementioned receiving means, ignoring changes in the level of the aforementioned control signal caused by the difference of voltage between the ground potential of the aforementioned controller and that of the aforementioned semiconductor device.

Such a configuration ensures control reliability to be improved without using a photo-coupler.

(9) It is preferred that the interface circuit according to the aforementioned item (8) be characterized in that the aforementioned transferring means is a noise absorber for electrically absorbing the aforementioned difference of voltage.

(10) It is preferred that the interface circuit according to the aforementioned item (9) be characterized in that the aforementioned noise absorber comprises:

a dead band generator that generates the low voltage dead band that does not allow current to flow until a certain voltage is reached, or a constant current dead band that allows constant current to flow until a certain voltage is reached, thereby absorbing the aforementioned difference of voltage;

a low signal generator for generating the low signal corresponding to the low level of the aforementioned control signal; and a high signal generator for generating the high signal corresponding to the high level of the aforementioned control signal.

(11) It is preferred that the interface circuit according to the aforementioned item (10) be characterized in that the dead band voltage of the aforementioned dead band generator is set at a level higher than the aforementioned difference of voltage.

(12) It is preferred that the interface circuit according to the aforementioned item (10) be characterized in that the aforementioned noise absorber comprises a current/voltage converting circuit that generates a high signal by converting constant current into voltage when the aforementioned constant current is allowed to flow by the aforementioned constant current dead band generator.

(13) It is preferred that the interface circuit according to the aforementioned item (8) be characterized by further comprising an amplifier that converts the aforementioned control signal outputted by the aforementioned transferring means, into the level of the aforementioned semiconductor device drive signal.

(14) It is preferred that the interface circuit according to the aforementioned item (13) be characterized in that the difference between power voltage and logic voltage amplitude of the aforementioned signal amplifier is set at a level higher than the aforementioned difference of voltage.

(15) To achieve the aforementioned object, the present invention provides an interface circuit for transmitting the control signal outputted from the controller for driving a semiconductor device, to the aforementioned semiconductor device. This interface circuit comprising:

means for electrically receiving the control signal outputted from the aforementioned controller; and means for transferring the received control signal to the aforementioned semiconductor device, ignoring changes in the level of the aforementioned control signal caused by the difference of voltage between the ground potential of the aforementioned controller and that of the aforementioned semiconductor device.

Such a configuration ensures control reliability to be improved without using a photo-coupler.

(16) To achieve the aforementioned object, the present invention provides a power converter comprising:

a power transistor, a small-signal circuit for driving the aforementioned power transistor, and an interface circuit for allowing the control signal to be transferred to the aforementioned power transistor from the aforementioned small-signal circuit;

the aforementioned interface circuit comprising a noise absorber that electrically absorbs the noise voltage produced between the ground of the aforementioned. small-signal circuit and that of the aforementioned power transistor, by the stray inductance of the aforementioned power transistor and a power module consisting of this power transistor;

the aforementioned power converter further characterized in that the aforementioned noise absorber ensures that the aforementioned control signal produced by the aforementioned small-signal circuit is transferred to the aforementioned power transistor, without being affected by the aforementioned noise voltage if produced.

Such a configuration ensures control reliability to be improved without using a photo-coupler.

(17) It is preferred that the power converter according to the aforementioned item (16) be characterized in that the aforementioned interface circuit comprises a signal amplifier for converting the control signal outputted by the aforementioned noise absorber, into the signal level for turning on or off the aforementioned power transistor, and the difference between power voltage VDC of the aforementioned interface circuit and logic voltage amplitude .Vlogic of the aforementioned signal amplifier (VDC−.Vlogic) is set at a level higher than the aforementioned noise voltage Vnoise.

(18) It is preferred that the power converter according to the aforementioned item (16) be characterized in that a soft-switching gate-drive circuit for reducing the switching speed of the aforementioned power transistor is arranged between the aforementioned interface circuit and power transistor.

(19) It is preferred that the power converter according to the aforementioned item (18) be characterized in that the aforementioned power transistor switching speed is set by the aforementioned soft-switching gate-drive circuit in such a way that the value, obtained by multiplying the inductance L of the aforementioned stray inductance by the change of current I (dI/dt) flowing through the aforementioned power transistor upon gradual switching of the power transistor by means of the aforementioned soft-switching gate-drive circuit, does not exceed the difference between power voltage VDC of the aforementioned interface circuit and logic voltage amplitude .Vlogic of the aforementioned signal amplifier (VDC−.Vlogic).

(20) To achieve the aforementioned object, the present invention provides an electric vehicle comprising:

a wheel drive motor;

a power converter for converting d.c. power supplied from a d.c. power source into a.c. power, and for controlling the current supplied to the aforementioned motor;

wherein the aforementioned power converter comprises:

a power transistor;

a motor small-signal circuit for driving the aforementioned power transistor; and an interface circuit for transferring control signals from this motor small-signal circuit to the aforementioned power transistor;

wherein the aforementioned interface circuit comprises a noise absorber that electrically absorbs the noise voltage produced between the ground of the aforementioned small-signal circuit and that of the aforementioned power transistor, by the stray inductance of the aforementioned power transistor and a power module consisting of this power transistor;

the aforementioned electric vehicle further characterized in that the aforementioned noise absorber ensures that the aforementioned control signal produced by the aforementioned small-signal circuit is transferred to the aforementioned power transistor, without being affected by the aforementioned noise voltage if produced.

Such a configuration ensures control reliability to be improved without using a photo-coupler.

DETAILED DESCRIPTION OF THE PREFERRED EMBODIMENTS

The following describes the configuration of an interface circuit as a first embodiment of the present invention with reference to FIGS. 1 through 4.

Figure 1:
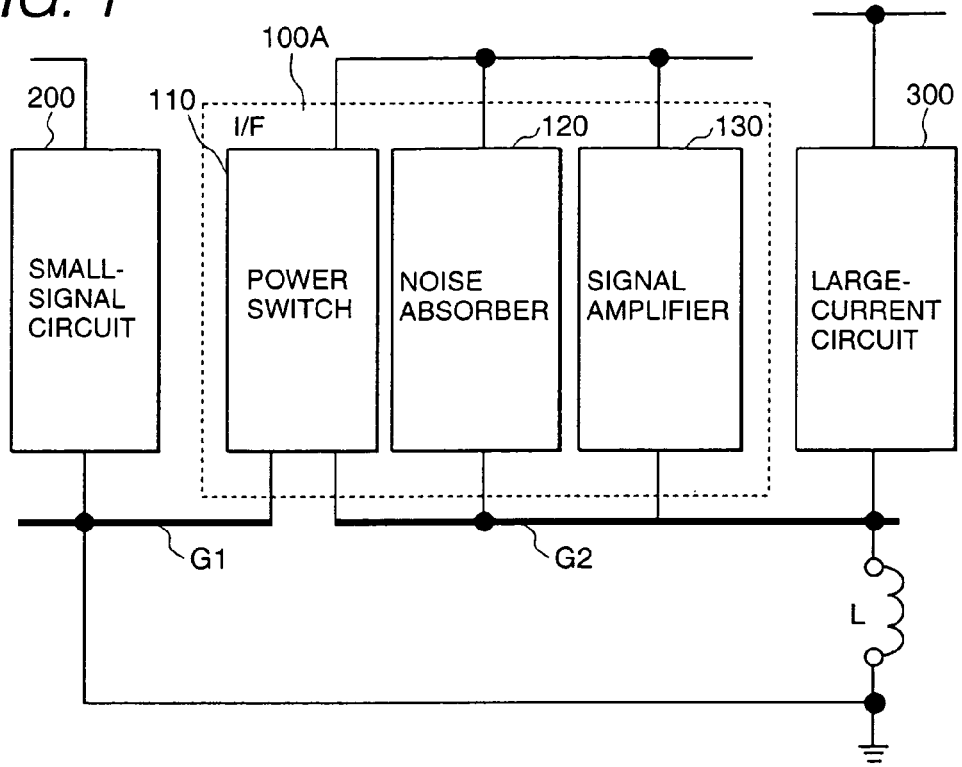
FIG. 1 is a block diagram representing the basic configuration of an interface circuit as a first embodiment of the present invention.
Figure 2:
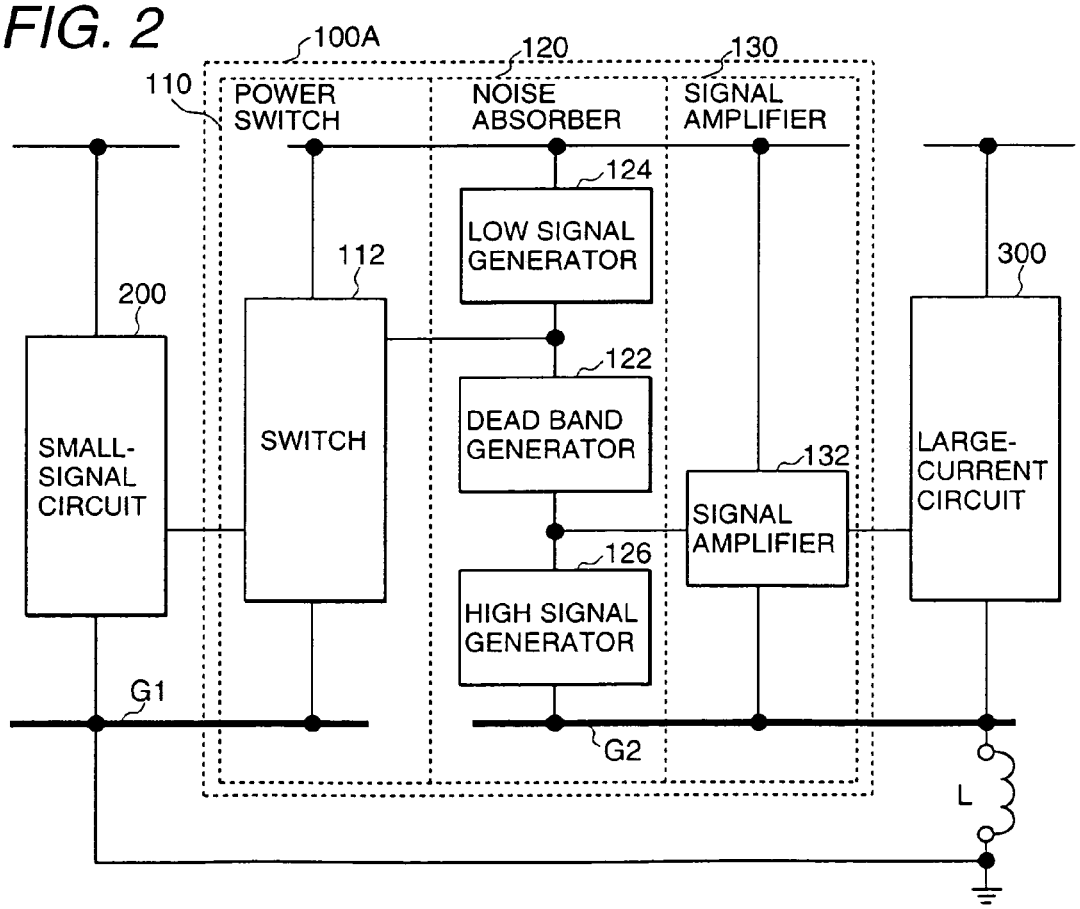
FIG. 2 is a block diagram representing a specific configuration of an interface circuit as the first embodiment of the present invention.
Figure 3:
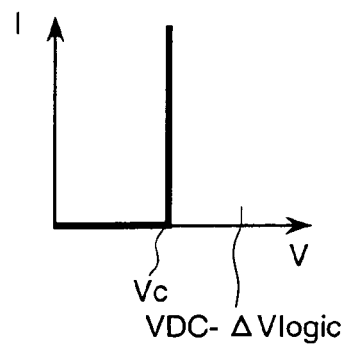
FIG. 3 is a diagram representing the characteristics of the constant voltage dead band generator used in an interface circuit as the first embodiment of the present invention.

FIG. 1 is a block diagram representing the basic configuration of an interface circuit as a first embodiment of the present invention. FIG. 2 is a block diagram representing a specific configuration of an interface circuit as the first embodiment of the present invention. FIG. 3 is a diagram representing the characteristics of the constant voltage dead band generator used in an interface circuit as the first embodiment of the present invention. FIG. 1 is a circuit diagram representing a power converter as the first embodiment of the present invention.

As shown in FIG. 1, the interface circuit (I/F) 100A as the present embodiment is arranged between a small-signal circuit 200 and a large-current circuit 300. The small-signal circuit 200 is connected to a ground wire G1, while a large-current circuit 300 is connected to a ground wire G2. As will be described later, the large-current circuit 300 incorporates a power semiconductor device (e.g. MOSFET) for driving the motor as a load. The power semiconductor device switches a large current I in a short time, with the result that noise voltage Vnoise occurs to stray inductance L. The noise voltage Vnoise having occurred can be expressed by the following Equation (1):

$$V\text{noise} = L \cdot dI/dt \quad (1)$$

When a current is not supplied to the power semiconductor device, noise voltage Vnoise is 0 volt. The potential VG1 of the ground wire G1 is equal to the potential VG2 of the ground wire G2. However, when current flows to the power semiconductor device, the potential VG1 of the ground wire G1 is higher than the potential VG2 of the ground wire G2 by noise voltage Vnoise. To put it another way, the potential VG1 of the ground wire G1 is equal to the potential VG2 of the ground wire G2 in some cases, while there is a difference of voltage in other cases.

The interface circuit 100A comprises a power switch 110, a noise absorber 120 and a signal amplifier 130. The noise absorber 120 absorbs the influence of noise voltage Vnoise even if the potential VG1 of the ground wire G1 is equal to the potential VG2 of the ground wire G2 or there is a difference of voltage, depending on the noise voltage Vnoise occurring to stray inductance L, in such a way that the on/off control signal from the small-signal circuit 200 is correctly transferred to the input section of the large-current circuit 300 as on/off signal.

The power switch 110 is supplied with power voltage of the interface circuit 100A, and is connected to the ground wire G1 of the small-signal circuit 200. The power switch 110 is a switch operated by the on/off control signal outputted from the small-signal circuit 200. As described above, the noise absorber 120 absorbs the influence of the noise voltage Vnoise and outputs the on/off signal (High/Low signal) on the power voltage level of the interface circuit 100A in response to the switching operation of the power switch 110.

The signal amplifier 130 changes the level of the on/off signal (High/Low signal) outputted from the noise absorber 120 so that it will be the on/off signal for on/off control of the power semiconductor device of the large-current circuit 300. It should be noted that the power switch 110 and noise absorber 120 are configured in one and the same circuit in some cases.

As shown in FIG. 2 more specifically, the power switch 110 is provided with a switch 112 spanning different large-current circuits. The noise absorber 120 contains a dead band generator 122, a low signal generator 124 and a high signal generator 126. As shown in FIG. 3, the dead band generator 122 does not allow current to flow until a certain voltage Vc is reached, and allows current to flow after the voltage Vc has been reached. Here the voltage Vc is called "dead band voltage". The low signal generator 124 generates low signals by allowing current to flow, while the high signal generator 126 generates high signals by allowing current to flow. The signal amplifier 130 compensates for the signal level so as to conform to the large-current circuit 300.

Since the dead band generator 122 is provided, the dead band generator 122 ensures that correct signals, i.e. low signals are transferred, without current being sent to the high signal generator 126, even if the potential VG1 of the ground wire G1 is higher than the potential VG2 of the ground wire G2, for example, when the switch 112 is on and the low signal is issued. As shown in FIG. 3, this dead band voltage Vc is made smaller than a value obtained by subtracting the logic voltage amplitude .Vlogic of the input unit of the signal amplifier from the power voltage VDC of the noise absorber. As described above, the noise absorber 120 containing the dead band generator 122 is provided and a power circuit for generating the noise lower than the dead band voltage Vc is formed, thereby allowing signals to be transferred among different power circuits, without using a signal transfer circuit consisting of an optical device.

Figure 4:
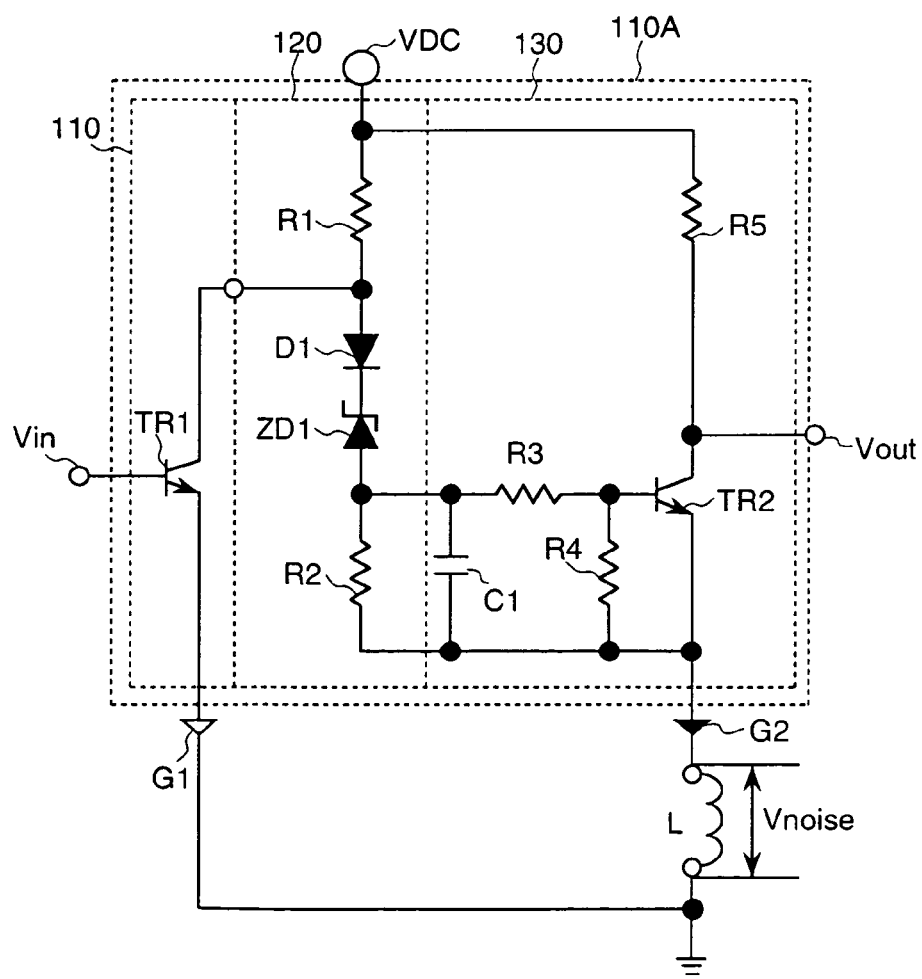
FIG. 4 is a circuit diagram representing the configuration of an interface circuit used in a power converter as a first embodiment of the present invention.

The following describes the specific circuit configuration with reference to FIG. 4.

The power switch 110 is provided with a transistor TR1. This transistor TR1 constitutes the switch 112 given in FIG. 2. The emitter of the transistor TR1 is connected to the ground wire G1. The on/off control signal Vin is inputted into the base of the transistor TR1 from the small-signal circuit 200. The collector of the transistor TR1 transfers signals to the noise absorber 120 where the ground wire G2 not completely insulated from the ground wire G1 is used as a ground.

The noise absorber 120 is equipped with a resistor R1, a diode D1, a zener diode ZD1 and resistor R2. The resistor R1 constitutes the low signal generator 124. The diode D1 and zener diode ZD1 constitute the dead band generator 122 given in FIG. 2. The resistor R2 constitutes the high signal generator 126 shown in FIG. 2.

The signal amplifier 130 is equipped with a capacitor C1, resistors R3, R4 and R5, and a transistor TR2. The capacitor C1 constitutes a filter circuit. The capacitor C1 cuts off the high frequency component so as to ensure that any operation error does not occur to transistor TR2 due to the noise signal superimposed on the voltage across the resistor R2 of the noise absorber 120 by the switching operation of the transistor TR1; whereby only the d.c. signal component is sent to the base of the transistor TR2. The resistors R3 and R4 constitute a resistance type potential divider circuit. When the voltage across resistor R2 is changed, for example, between high level (1 volt) and low level (0 volt), it is converted into the voltage of high level (0.6 volt)/low level (0 volt) required to turn on or off the transistor TR2. The resistor R5 is a pull-up resistor. When the transistor TR2 has turned on, the output voltage Vout of the signal amplifier 130 is reduced to 0 volt. When the transistor TR2 has turned off, the output voltage of the signal amplifier 130 is turned into the power voltage VDC (e.g. 12 volts) of the signal amplifier 130. The voltage Vin entering the power switch 110 is the on/off control signal from the small-signal circuit 200. If a microcomputer is used as the small signal circuit 200, for example, the input voltage Vin has the high level (0.6 volt)/low level (0 volt), for example. On the other hand, the voltage Vth for turning on the power semiconductor used in the large-current circuit 300 is 3 volts. Thus, the input voltage Vin (high level (0.6 volt)/low level (0 volt)) is converted into the output voltage Vout (high level (12 volts)/low level (0 volt)) higher than that by the signal amplifier 130.

The following describes the operation of the interface circuit 100A according to the present embodiment:

When the input voltage of the power switch 110 (base terminal voltage of transistor TR1) is low, current flows to the zener diode ZD1 located on the dead band generator 122 and the resistor R2 on the high signal generator. This allows the transistor TR2 of the signal amplifier 130 to be turned on, and the output voltage Vout of the signal amplifier 130 goes low. In this case, the transistor TR1 is off and the collector terminal of the transistor TR1 is open. Accordingly, even if noise has caused difference of voltage to occur between the ground wire G1 and ground wire G2, exchange of signals is not affected.

The voltage applied between the emitter and collector of the transistor TR1 is equivalent to the noise voltage Vnoise, plus the power voltage VDC of the interface circuit 100A. The voltage applied between the emitter and collector of the transistor TR1 must be reduced to below the breakdown voltage BVceo of the transistor TR1. This requires the following equation (2) to be satisfied:

$$Vnoise + VDC < BVceo \quad (2)$$

Further, means must be provided to ensure that reverse bias is not applied between the base and emitter of the transistor TR1. This requires, the following equation (3) to be met:

$$Vnoise + VDC > 0 \quad (3)$$

Thus, Equations (2) and (3) requires the following equation (4) to be satisfied by the difference of voltage between the ground wire G1 and ground wire G2, i.e. noise voltage Vnoise:

$$-VDC < Vnoise < BVceo - VDC \quad (4)$$

Individual voltages will be described later. For example, when the power voltage VDC of the interface circuit 100A is 12 volts and the breakdown voltage BVceo of the transistor TR1 is 60 volts, then the noise voltage Vnoise meeting the Equation (4) must meet the following Equation (5):

$$-12V < \text{noise voltage } Vnoise < 48V \quad (5)$$

The noise voltage Vnoise, as described in Equation (1), is determined by stray inductance L and the change dI/dt of the current flowing through this stray inductance. If the stray inductance L is determined in advance, Equation (4) can be satisfied by ensuring that the change dI/dt in the current flowing through the stray inductance reaches a predetermined value in response to this value.

When the input voltage (base terminal voltage of the transistor TR1) of the power switch 110 is high, current does not flow to the zener diode ZD1 corresponding to the dead band generator 122. The transistor TR2 is turned off, and the output voltage Vout of the interface circuit 100A goes high. The potential of the collector terminal of the transistor TR1 at this time is almost the same as the potential of the ground wire G1. Even if the potential of the ground wire G1 is made higher than that of the ground wire G2 by noise, the transistor TR2 will not be turned on by mistake, if it does not exceed the zener voltage of the zener diode ZD1. In this case, the zener voltage of the zener diode ZD1 corresponds to the dead band voltage Vc of the dead band generator 122. If the operating voltage (voltage across resistor R4; base emitter voltage of transistor TR2) of the transistor TR2 is .Vlogic, it is essential to meet the following Equation (6):

$$Vc + Vlogic < VDC \quad (6)$$

When the potential of the ground wire G1 is reduced below that of the ground wire G2 by noise, the current passing through the transistor TR1 will be increased. However, if it does not exceed the maximum current value of the transistor TR1 or the reverse breakdown voltage of the diode D1, the operation of the transistor TR2 is not affected. This requires the following Equation (7) to be satisfied between the zener voltage (dead band voltage Vc of the dead band generator 122) of the zener diode ZD1 and noise voltage Vnoise:

$$Vnoise < Vc \quad (7)$$

Thus, it follows from equations (6) and (7) that a system characterized by sufficient noise stability can be configured if the following Equation (8) is satisfied by the zener voltage (dead band voltage Vc of dead band generator 122) of the zener diode ZD1:

$$Vnoise < Vc < VDC - .Vlogic \quad (8)$$

For example, if the power voltage VDC of the interface circuit 100A is 12 volts and the operating voltage of the transistor TR2 is .Vlogic, then the Equation (8) is converted into the following Equation (9):

Noise voltage Vnoise<dead band voltage Vc<12V−0.6V (9)

Accordingly, if the noise voltage Vnoise meeting the Equation (6) is 10 volts, for example, then the dead band voltage Vc meeting Equation (9) will be 10V<dead band voltage Vc<11.4V, for example.

As described above, when a constant voltage dead band circuit is used in the interface circuit between the small-signal circuit and large-current circuit, control signals can be transmitted to the large-current circuit without being affected by noise voltage even if there is fluctuation in the voltage between the ground wire G1 and ground wire G2 due to the noise voltage resulting from stray inductance. Further, control signals can be transferred to the large-current circuit without using an optical device such as a photo-coupler.

Figure 5:
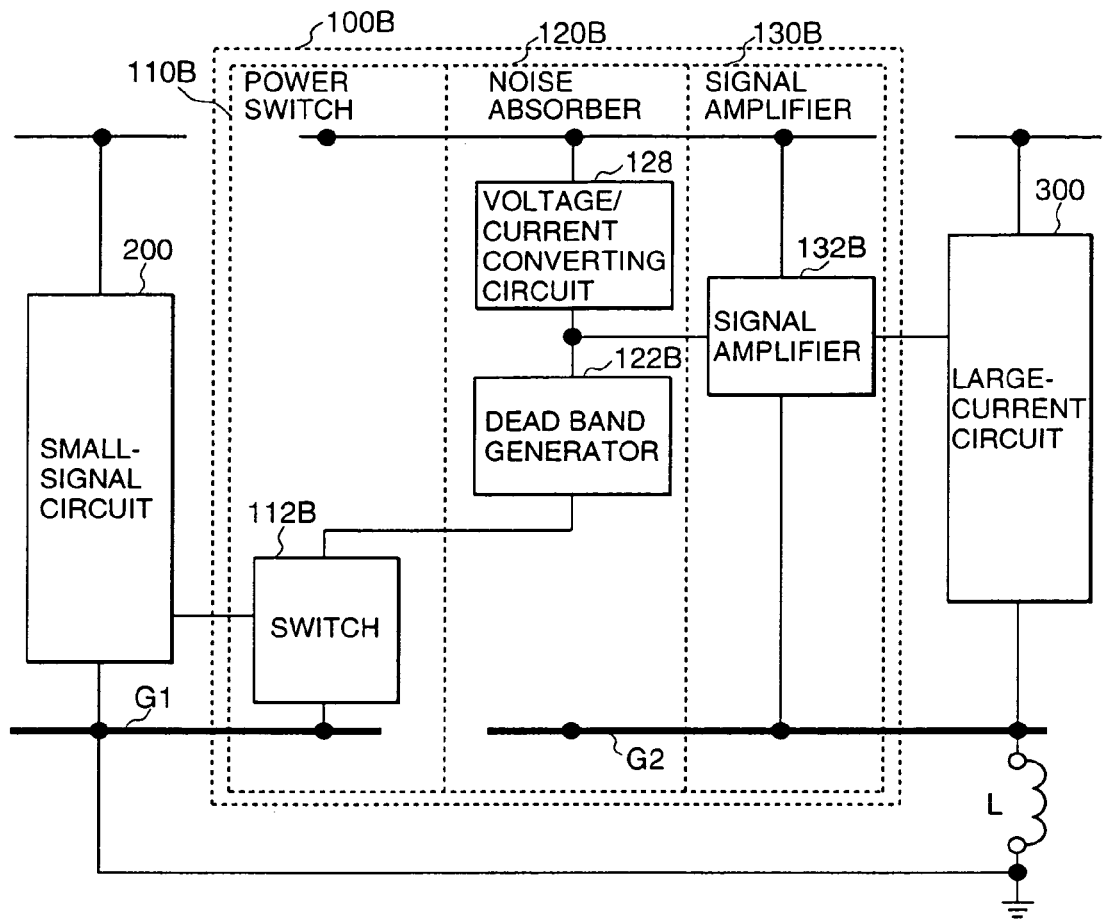
FIG. 5 is a block diagram representing the specific configuration of an interface circuit as a second embodiment of the present invention.
Figure 6:
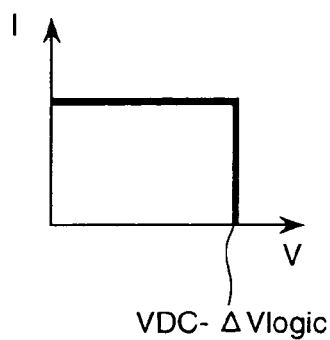
FIG. 6 is a characteristic diagram for the constant current dead band generator used in an interface circuit as a second embodiment of the present invention.
Figure 7:
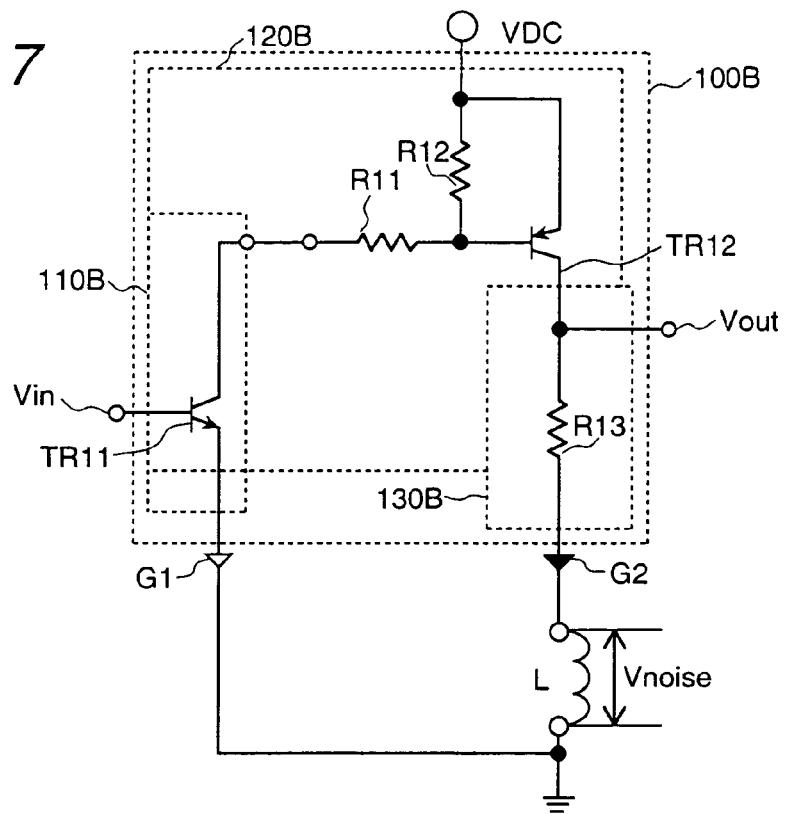
FIG. 7 is a circuit diagram representing the configuration of an interface circuit as a second embodiment of the present invention.

The following describes the configuration of an interface circuit as a second embodiment of the present invention, with reference to FIGS. 5 through 7:

FIG. 5 is a block diagram representing the specific configuration of an interface circuit as a second embodiment of the present invention. FIG. 6 is a characteristic diagram for the constant current dead band generator used in an interface circuit as a second embodiment of the present invention. FIG. 7 is a circuit diagram representing the configuration of an interface circuit as a second embodiment of the present invention.

The basic configuration of the interface circuit as the present embodiment is the same as that given in FIG. 1. As shown in FIG. 5, the interface circuit 100B contains a power switch 110B, a noise absorber 120B and a signal amplifier 130B. The noise absorber 120B absorbs the influence of noise voltage Vnoise even if the potential VG1 of the ground wire G1 is equal to the potential VG2 of the ground wire G2 or there is a difference of voltage, depending on the noise voltage Vnoise occurring to stray inductance L, in such a way that the on/off control signal from the small-signal circuit 200 is correctly transferred to the input section of the large-current circuit 300 as on/off signal. Whereas constant voltage dead band generator is used as a dead band generator 122 in the example given in FIG. 2, the constant current dead band generator is used as such in the present embodiment.

The power switch 110B is provided with a switch 112B spanning different large-current circuits. The noise absorber 120B contains a constant current dead band generator 122B and a current/voltage converting circuit 128. A constant current generating circuit is formed by a switch 112B and a dead band generator 122B. When the switch 112B is turned on and constant current is allowed to flow by the dead band generator 122B, this constant current is converted into voltage by means of a current/voltage converting circuit 128. Then a signal is produced in a node A1 and is transferred. As shown in FIG. 6, a constant current can be supplied to node A1 and signals can be transmitted, even if there is fluctuation in the potential VG1 of the ground wire G1 and the potential VG2 of the ground wire G2, provided that such fluctuation is within the range of voltage that allows constant current to flow; i.e. such fluctuation is smaller than the value obtained by subtracting the logic voltage amplitude .Vlogic of the input unit of the signal amplifier 132B from the power voltage VDC of the noise absorber. The signal amplifier 130B corrects the signal level so as to conform to the logic amplitude of the large-current circuit 300.

As described above, when the noise absorber 120B containing a constant current dead band generator 122B is provided, signals can be transferred among different power circuits, without using a signal transfer circuit based on an optical device.

The following describes the specific configuration of the interface circuit 100B according to the present embodiment with reference to FIG. 7:

The power switch 110B is equipped with a transistor TR11. When transistor TR11 constitutes a switch 112B shown in FIG. 5. An on/off control signal Vin is inputted into the base of the transistor TR11 from the small-signal circuit 200 shown in FIG. 5. The collector of the transistor TR11 transfers signals to the noise absorber 120B where the ground wire G2 not completely insulated from the ground wire G1 is used as a ground.

The noise absorber 120B is equipped with resistors R11 and R12 and a transistor TR12. The resistor R12 and transistor TR12 constitute a current/voltage converting circuit 128 shown in FIG. 5. Using the constant current characteristics of the transistor TR11, they constitute the constant current dead band generator 122B of FIG. 5, together with resistor R11.

The signal amplifier 130B is equipped with a resistor R13. When the transistor TR12 has turned on, the output voltage Vout of the signal amplifier 130B reaches the level of power voltage VDC (e.g. 12 volts). If the transistor TR12 has turned off, the output voltage of the signal amplifier 130B is reduced to 0 volt.

The following describes the operation of the interface circuit 100B according to the present embodiment:

When the transistor TR11 is off, no current flows to the resistor R11 or R12. This causes the transistor TR12 to be turned off, with the result that output voltage Vout goes low. In this case, the collector terminal of the transistor TR11 is opened basically; therefore, exchange of signals is not affected even if difference of voltage has occurred between the ground wire G1 and ground wire G2 due to noise.

When there is an increase in the difference of voltage of the ground, overvoltage in excess of the breakdown voltage BVceo of the transistor TR11 may be applied between the emitter and collector of the transistor TR11, or reverse bias may be applied between the base and emitter in some cases. This requires the following Equation (4) to be satisfied, as mentioned above.

$$-VDC < Vnoise < BVceo - VDC \qquad (4)$$

When the transistor TR11 turns on and the collector terminal of the transistor TR11 has a low level, the transistor TR12 turns on and output voltage Vout goes high. In this case, a constant current flows between the collector and emitter of the transistor TR11 and to the resistors R11 and R12. This current drives the transistor TR12. To put it another way, the transistor TR11 serves as a power switch to perform switching operation, and at the same time, generates the constant current dead band for feeding a collector current proportional to base current. Accordingly, despite the fluctuation of potential between the ground wire G1 and ground wire G2, a constant current flows to the resistors R11 and R12, thereby allowing the transistor TR12 to be turned on.

If the potential of the ground wire G2 with respect to ground wire G1 is increased over the value obtained by subtracting the logic amplitude .Vlogic of the transistor TR11 from the power voltage VDC of the noise absorber 120B, then the flow of current to the transistor TR11 will be discontinued. This requires the following Equation (10) to be satisfied, as in the case of Equation (8).

$$Vnoise < VDC - Vlogic \quad (10)$$

As described above, when a constant voltage dead band circuit is used in the interface circuit between the small-signal circuit and large-current circuit, control signals can be transmitted to the large-current circuit without being affected by noise voltage even if there is fluctuation in the voltage between the ground wire G1 and ground wire G2 due to the noise voltage resulting from stray inductance. Further, control signals can be transferred to the large-current circuit without using an optical device such as a photo-coupler. Thus, this method ensures improved control reliability without the need of using a photo-coupler.

Figure 8:
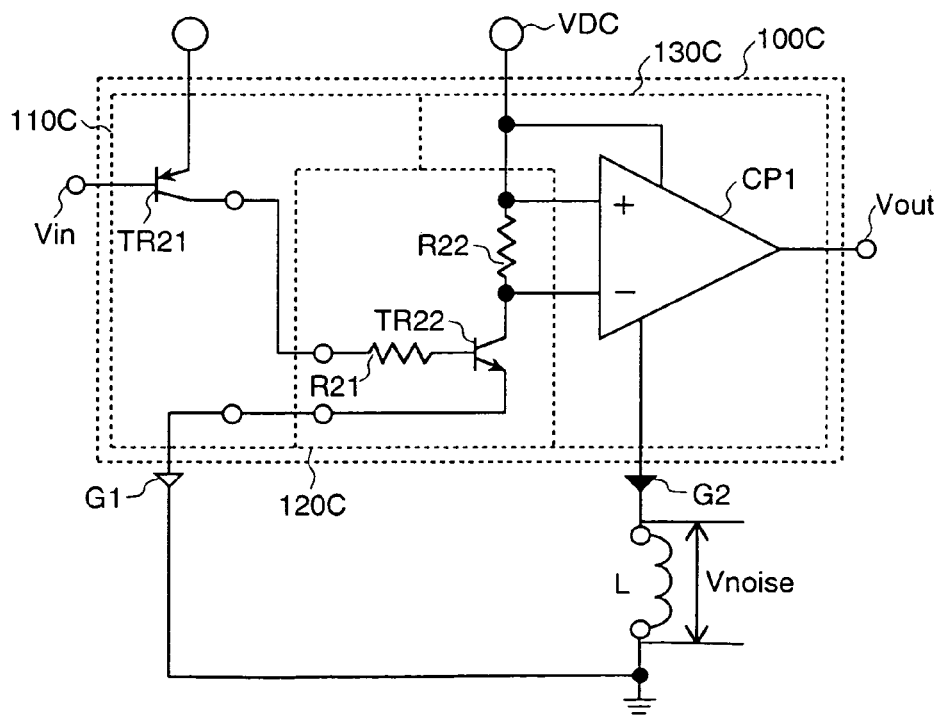
FIG. 8 is a circuit diagram representing the configuration of an interface circuit as a third embodiment of the present invention.

The following describes the configuration of an interface circuit as a third embodiment of the present invention with reference to FIG. 8:

FIG. 8 is a circuit diagram representing the configuration of an interface circuit as a third embodiment of the present invention.

The basic configuration of the interface circuit according to the present embodiment is the same as the one given in FIG. 1. The specific configuration of the interface circuit is the same as the one shown in FIG. 5. As shown in FIG. 8, the interface circuit 100C is equipped with a power switch 110C, a noise absorber 120C and a signal amplifier 130C. The noise absorber 120C is absorbs the influence of noise voltage Vnoise, even if the potential VG1 of the ground wire G1 is equal to the potential VG2 of the ground wire G2 or there is a difference of voltages, depending on the output voltage Vout occurring to the stray inductance L, in such a way that the on/off control signal from the small-signal circuit 200 is correctly transferred to the input section of the large-current circuit 300 as on/off signal. In the present embodiment, a constant current dead band generator is used as the dead band generator 122, similarly to the case of FIG. 7.

The power switch 110C is equipped with a transistor TR21, which corresponds to the switch 112B given in FIG. 5. The collector of the transistor TR21 is connected to the ground wire G1 through the noise absorber 120C. The on/off control signal Vin is inputted into the base of the transistor TR21 from the small-signal circuit 200 given in FIG. 5. The collector of the transistor TR21 transfers signals to the noise absorber 120C where the ground wire G2 not completely insulated from the ground wire G1 is used as a ground.

The noise absorber 120C is equipped with resistors R21 and R22 and a transistor TR22. The transistor TR2 and the resistor R21 constitute a constant current dead band generator 122B shown in FIG. 5. The resistor R22 constitutes a current/voltage converting circuit 128 shown in FIG. 5.

The signal amplifier 130C has a comparator CP1. When the transistor TR22 has turned on, voltage is applied to the comparator CP1 of the signal amplifier 130C, and the output voltage Vout of the signal amplifier 130 reaches the level of power voltage VDC (e.g. 12V). When the transistor TR22 has turned off, the output voltage of the signal amplifier 130 is reduced to 0 volt.

The following describes the operation of the interface circuit 100C according to the present embodiment:

When the transistor TR21 is off, the transistor TR22 is also turned off and no current flows to the resistor R22. This causes output voltage Vout to be reduced to a low level. In this case, the transistor TR22 is opened basically; therefore, exchange of signals is not affected even if difference of voltage has occurred between the ground wire G1 and ground wire G2 due to noise.

When there is an increase in the difference of voltage of the ground, overvoltage in excess of the breakdown voltage BVceo of the transistor TR22 may be applied between the emitter and collector of the transistor TR22, or reverse bias may be applied between the base and emitter in some cases. This requires the following Equation (4) to be satisfied, as mentioned above.

$$-VDC < Vnoise < BVceo - VDC \quad (4)$$

When the transistor TR21 turns on and current flows to the resistor R21 and between the base and emitter of the transistor TR22, then the transistor TR22 turns on and current flows to the resistor R22, with the result that the output voltage Vout of the comparator CP1 goes high. In this case, the transistor TR22 generates the constant current dead band for passing a constant current to the resistor R22. This ensures that a constant current flows to the resistors R21 and R22 and the output of the comparator CP1 to be kept at a high level, despite a potential fluctuation between the ground wire G1 and ground wire G2.

If the potential of the ground wire G2 with respect to ground wire G1 is increased over the value obtained by subtracting the logic amplitude .Vlogic of the transistor TR22 from the power voltage VDC of the noise absorber 120C, then the flow of current to the transistor TR22 will be discontinued. This requires the following Equation (10) to be satisfied, as described above.

$$Vnoise < VDC - Vlogic \quad (10)$$

As described above, when a constant voltage dead band circuit is used in the interface circuit between the small-signal circuit and large-current circuit, control signals can be transmitted to the large-current circuit without being affected by noise voltage even if there is fluctuation in the voltage between the ground wire G1 and ground wire G2 due to the noise voltage resulting from stray inductance. Further, control signals can be transferred to the large-current circuit without using an optical device such as a photo-coupler. Thus, this method ensures improved control reliability without the need of using a photo-coupler.

Figure 9:
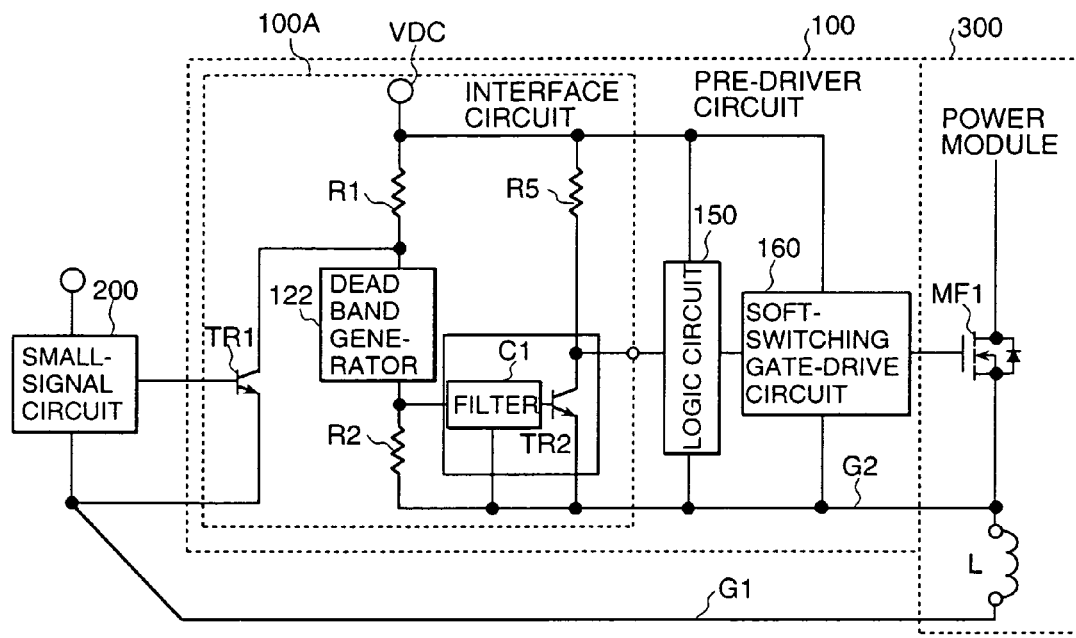
FIG. 9 is a block diagram representing the configuration of a power converter as a second embodiment of the present invention.

Referring to FIG. 9, the following describes the configuration of the power converter using an interface circuit according to the first embodiment of the present invention:

FIG. 9 is a block diagram representing the configuration of a power converter using an interface circuit according to the first embodiment of the present invention. The same portions as those in FIGS. 2 and 4 will be assigned with the same numerals of reference.

The power converter circuit according to the present embodiment comprises a small-signal circuit 200, a pre-driver circuit 100 and power module 300. The pre-driver circuit 100 contains an interface circuit 100A described with reference to FIGS. 2 and 4, a logic circuit 150 and a soft-switching gate-drive circuit 160.

The small-signal circuit 200 has a microcomputer and others. The power module 300 is equipped with a power transistor MF1, which consists of a MOSFET, for example. The small-signal circuit 200 outputs the control signal for on-off control of the power transistor MF1. This control signal is supplied to the MOSFET gate as a power transistor MF1 by the interface circuit 100A of the pre-driver circuit 100, without being affected by the noise voltage produced by the stray inductance L of the power transistor MF1. In this manner, on-off operation of the power transistor MF1 is performed. This step turns on and off-the current flowing through the power transistor MF1, whereby a voltage converter for converting d.c. voltage into a.c. voltage can be configured.

The interface circuit 100A comprises transistors TR1 and TR2, resistors R1 and R2, a dead band generator 122 and a filter C1. The transistor TR1 constitutes the switch 112 in the power switch 110 shown in FIG. 2. The constant voltage dead band generator 122 consists of a diode D1 and a zener diode ZD1, as shown in FIG. 2. The resistor R1 constitutes a low signal generator. 124 shown in FIG. 2. The filter circuit is composed of a capacitor C1 shown in FIG. 2. The resistor R5 and resistor TR2 constitutes a signal amplifier 130 shown in FIG. 2.

The operation of the interface circuit 100A is as described with reference to FIG. 4. Use of an interface circuit allows control signals to be sent to the power module 300 without being affected by the noise voltage resulting from stray inductance.

When an incorrect signal is included in the signals transferred from the interface circuit 100A to the power module 300, the logic circuit 150 screens out the incorrect signal so as to prevent the power module 300 from performing an operation error. The soft-switching gate-drive circuit 160 ensures moderate changes of the voltage entering the gate of the MOSFET as the power transistor MF1, moderate turning on of the power transistor MF1, and moderate flow of the current I through the power transistor MF1. As described with reference to Equation (1), noise voltage Vnoise is determined by stray inductance L and the change dI/dt of the current I flowing through the power transistor MF1, with respect to time. If the stray inductance L is known in advance, the noise voltage Vnoise can be set to a predetermined value by controlling the changes in the voltage entering the gate of the MOSFET as the power transistor MF1 by the soft-switching gate-drive circuit 160.

The drive signal of the power transistor MF1 outputted from the interface circuit 100A drives the MOSFET as a power transistor MF1 through the logic circuit 150 and soft-switching gate-drive circuit 160. If the voltage applied to the power terminal of the pre-driver circuit 100 is VDC, it depends on the gate drive voltage of the MOSFET as a power transistor MF1, since the VDC also serves as a power supply for the interface circuit 100A, logic circuit 150 and a gate-drive circuit 160 in normal times. Generally, it is in the range from 10 through 20 volts. Further, the noise voltage Vnoise is expressed by the following Equation (10).

$$Vnoise<VDC-.Vlogic \quad (10)$$

The .Vlogic representing the logic amplitude of the signal amplifier consisting of the filter C1 and transistor TR2 is of the order of 0.6 volts —corresponding to the base drive voltage of the transistor TR2. A power converter having an interface circuit characterized by excellent noise stability without being affected by the noise voltage is required to meet the Equation (10). Assuming that VDC is 12 volts, for example, it is necessary to meet the Equation (11):

$$Vnoise<12-0.6=11.4[V] \quad (11)$$

Noise voltage Vnoise is determined by two factors: a stray inductance L present in the circuit of power module 109, and change dI/dt of the current flowing through the stray inductance L, with respect to time. The value L of the stray inductance is determined by the wiring and structure inside the module. The change dI/dt of the current with respect to time is determined by the constant of the soft-switching gate-drive circuit 160. If the switching speed of the MOSFET is reduced, the change dI/dt of the current with respect to time is also reduced, with the result that noise voltage Vnoise can be kept at a low level. However, if the MOSFET is switched slowly, the non-saturated circuit region (active region) will be used for a long time, resulting in an increased switching loss. Thus, in order to ensure compatibility between the minimum loss and minimum noise, it is necessary to minimize the inductance and to select the optimum change dI/dt of the current with respect to time. For example, when the module with inductance below 100 nH is utilized, the gate resistance is adjusted so that the change of current with respect to time is kept below 100 A/.s. This step results in the following Equation (12):

$$Vnoise<100[nH]\times100[A/.s]=10[V] \quad (12)$$

The dead band voltage Vc is selected so as to meet the following Equation (13):

$$10[V]<Vc<11.4[V] \quad (13)$$

This will provide a power converter that meets the Equation (8) as described above.

$$Vnoise<Vc<VDC-.Vlogic \quad (8)$$

In the configuration shown in FIG. 9, it is also possible to make such arrangements that the transistor TR1 constituting the power switch is incorporated in the small-signal circuit 200.

As described above, control signals can be transferred without using an optical device such as a photo-coupler by using an interface circuit that allows control signals to be transferred to a large-current circuit without being affected by the noise voltage resulting from stray inductance. Therefore, this method ensures improved control reliability without the need of using a photo-coupler.

Figure 10:
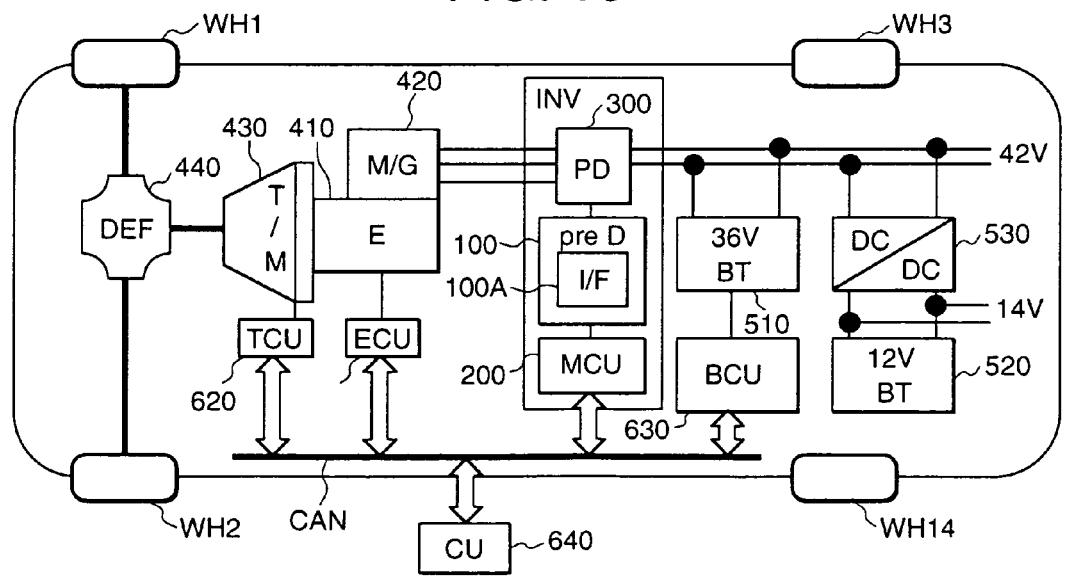
FIG. 10 is a block diagram representing the configuration of the electric vehicle using an interface according to the first embodiment of the present invention.
Figure 11:
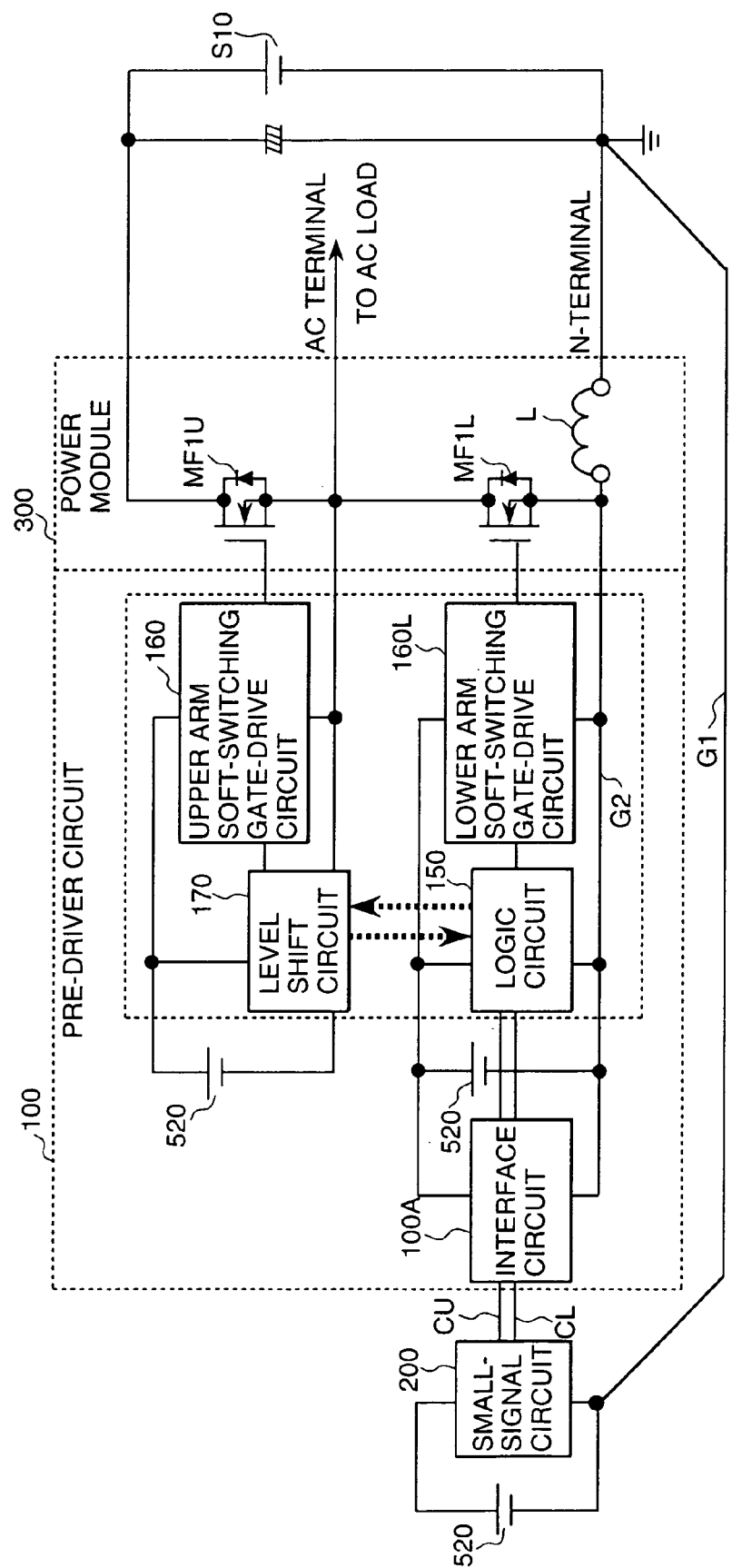
FIG. 11 is a block diagram representing the configuration of a power converter used in the electric vehicle shown in FIG. 10.

The following describes the configuration of an electric vehicle using an interface circuit according to the first embodiment of the present invention, with reference to FIGS. 10 and 11:

FIG. 10 is a block diagram representing the configuration of the electric vehicle using an interface according to the first embodiment of the present invention. FIG. 11 is a block diagram representing the configuration of a power converter used in the electric vehicle shown in FIG. 10.

It should be noted that the same portions in FIGS. 2, 3 and 4 will be assigned with the same numerals of reference.

As shown in FIG. 10, the electric vehicle of the present embodiment is equipped with an engine (E) 410 and a motor generator (M/G) 420 as drive power sources. The drive force generated by the engine (E) 410 and motor generator (M/G) 420 is transferred to the wheels WH1 and WH2 through a transmission (T/M) 430 and a differential gear (DEF) 440, whereby a vehicle is driven. In this case, the motor generator (M/G) 420 is used to assist the engine (E) 410. The present embodiment can be applied to a parallel drive system where wheels are driven independently by the engine and motor, respectively. Further, it can also be applied to an electric vehicle where the wheels are driven by the motor alone.

The a.c. power supplied to the motor generator (M/G) 420 is obtained by converting the d.c. power stored in a 36-volt battery 510 by means of an inverter INV. The inverter INV consists of a motor control unit (MCU) 200, a pre-driver circuit 100 with a built-in interface circuit 100A and a power driver 300. When the motor generator (M/G) 420 works as a power generator, the a.c. power generated by the power generator is converted into the d.c. power by means of an inverter INV, and is stored in the 36-volt battery 510. It is further converted into the d.c. voltage by a DC-DC converter 530, and is stored in a 14-bolt battery 520.

The motor control battery 200, engine control unit 610 for controlling the engine (E) 410, transmission control unit 620 for controlling the motor generator (M/G) 420 and battery control unit 630 for controlling the battery are integrated and controlled by an overall controller (CU) through the control area network CAN.

As shown in FIG. 11, the power converter of the present embodiment consists of a small-signal circuit (motor control unit) 200, a pre-driver circuit 100 and a power module 300. The pre-driver circuit 100 is equipped with an interface circuit 100A, an logic circuit 150, a lower arm soft-switching gate-drive circuit 160L, an upper arm soft-switching gate-drive circuit 160U and a level shift circuit 170. The power module 300 comprises a MOSFET as a power transistor MF1L mounted on the lower arm, and a MOSFET as a power transistor MF1U mounted on the upper arm. The small-signal circuit 200 outputs the control signal CL for on-off control of the power. transistor MF1L mounted on the lower arm, and the control signal CU for on-off control of the power transistor MF1U mounted on the upper arm. The internal configuration of the interface circuit 100A is the same as that given in FIG. 9, provided that this circuit contains an interface circuit for the control signal CL for on-off control of the power transistor MF1L mounted on the lower arm, and an interface circuit for the control signal CU for on-off control of the power transistor MF1U mounted on the upper arm. When there has occurred an incorrect signal that requires simultaneous turning on of both the power transistor MF1L mounted on the lower arm and the power transistor MF1U mounted on the upper arm, the logic circuit 150 detects this incorrect signal and cuts it off, thereby preventing the power module 300 from performing an incorrect operation.

The lower arm soft-switching gate-drive circuit 160L has the same configuration as that of the soft switching gate-drive circuit 160 shown in FIG. 9. The lower arm soft-switching gate-drive circuit 160L provides on-off control of the MOSFET as a power transistor MF1L by means of the control signals transferred without being affected by the stray inductance, by the aid of the interface circuit 100A.

Assume that the gate voltage for on-off control of the MOSFET as the power transistor MF1L of the lower arm is one of high level (12 volts)/low level (0 volt), and the voltage applied between the terminal of the power module 300 and N-terminal from the battery 510 is 42 volts. Then the voltage for on-off control of the MOSFET as a power transistor MF1U of the upper arm must be the voltage of high level (54 volts)/low level (42 volts). To put it another way, this requires a 42-volt level shift. This is why the level shift circuit 170 is utilized.

The control signal CU transferred without being affected by stray inductance by the aid of interface circuit 100A is level-shifted, for example, by 42 volts through the level shift circuit 170, and is supplied to the upper arm soft-switching gate-drive circuit 160U. The upper arm soft-switching gate-drive circuit 160U has the same configuration as that of the soft-switching gate-drive circuit 160 shown in FIG. 9. The upper arm soft-switching gate-drive circuit 160U provides on-off control of the MOSFET as a power transistor MF1U by means of the control signals transferred without being affected by the stray inductance, by the aid of the interface circuit 100A.

The small-signal circuit (motor control unit) 200 not only converts the d.c. 36-volt power of the battery into the a.c. power to supply it to the motor generator 420. It also controls the motor torque generated by the motor generator 420, by changing the motor current supplied to the motor generator 420 through the control of the ON-time of the power transistors MF1U and MF1L.

As described above, the interface circuit allows control signals to be sent to the large-current circuit without being affected by the noise voltage resulting from stray inductance. Use of this interface circuit permits control signals to be transferred to the large-current circuit without using an optical device such as a photo-coupler, whereby it ensures improved control reliability of an electric vehicle without employing a photo-coupler.

In an interface circuit, a power converter using the same and an electric vehicle using the same, the present invention ensures improved control reliability without employing a photo-coupler.

What is claimed:

1. An interface circuit for transferring a control signal from a small-signal circuit to a power transistor, for driving said power transistor, said interface circuit comprising a noise absorber for electrically absorbing noise voltage produced between ground of said small-signal circuit and that of said power transistor; wherein,
   said noise absorber ensures that said control signal produced by said small-signal circuit is transferred to said power transistor, without being affected by said noise voltage if produced;
   said noise absorber comprises one of a constant voltage dead band generator that does not allow current to flow until a certain voltage is reached, and a constant current dead band generator that allows constant current to flow until a certain voltage is reached; and
   said dead band electrically absorbs the influence of said noise voltage.

2. The interface circuit according to claim 1 wherein said noise absorber further comprises, in addition to said constant voltage dead band;
   a low signal generator for generating a low signal corresponding to a low level of said control signal; and
   a high signal generator for generating a high signal corresponding to a high level of said control signal.

3. The interface circuit according to claim 2 wherein said dead band voltage Vc of said constant voltage dead band is set at a level higher than said noise voltage Vnoise.

4. The interface circuit according to claim 1 wherein said noise absorber further comprises, in addition to said constant current dead band, a current/voltage converting circuit that generates a high signal by converting constant current into voltage when said constant current is allowed to flow by said constant current dead band.

5. An interface circuit for transferring a control signal from a small-signal circuit to a power transistor, for driving said power transistor, said interface circuit comprising a noise absorber for electrically absorbing noise voltage produced between ground of said small-signal circuit and that of said power transistor; wherein
   said noise absorber ensures that said control signal produced by said small-signal circuit is transferred to said power transistor, without being affected by said noise voltage if produced; and
   said interface circuit further comprises a signal amplifier that converts the control signal outputted by said noise absorber, into signal level for turning on or off said power transistor.

6. The interface circuit according to claim 5 wherein a difference between power voltage VDC and logic voltage amplitude ΔVlogic of said signal amplifier (VDC−ΔVlogic) is set at a level higher than said noise voltage Vnoise.

7. An interface circuit for transferring a control signal to a module containing a semiconductor device, said control signal being outputted from a controller for driving said semiconductor device, wherein said interface circuit comprise:
- receiving means for electrically receiving said control signal outputted from said controller;
- transferring means for transferring to said module said control signal received by said receiving means, ignoring changes in the level of said control signal caused by a difference of voltage between ground potential of said controller and that of said semiconductor device;
- wherein said transferring means is a noise absorber for electrically absorbing said difference of voltage.

8. The interface circuit according to claim 7 said noise absorber comprises:
- a dead band generator that generates one of a low voltage dead band that does not allow current to flow until a certain voltage is reached, and a constant current dead band that allows constant current to flow until a certain voltage is reached, thereby absorbing said difference of voltage;
- a low signal generator for generating a low signal corresponding to a low level of said control signal; and
- a high signal generator for generating a high signal corresponding to high level of said control signal.

9. The interface circuit according to claim 8 wherein the dead band voltage of said dead band generator is set at a level higher than said difference of voltage.

10. The interface circuit according to claim 8 wherein said noise absorber comprises a current/voltage converting circuit that generates a high signal by converting constant current into voltage when said constant current is allowed to flow by said constant current dead band generator.

11. The interface circuit according to claim 7 further comprising an amplifier that converts said control signal outputted by said transferring means, into the level of said semiconductor device drive signal.

12. The interface circuit according to claim 11, wherein the difference between power voltage and logic voltage amplitude of said signal amplifier is set at a level higher than said difference of voltage.

13. A power converter comprising:
- a power transistor;
- a small-signal circuit for driving said power transistor; and
- an interface circuit for allowing the control signal to be transferred to said power transistor from said small-signal circuit; wherein,
- said interface circuit comprises a noise absorber that electrically absorbs noise voltage produced between ground of said small-signal circuit and that of said power transistor, by the stray inductance of said power transistor and a power module consisting of this power transistor;
- said noise absorber is operated as one of a constant voltage dead band generator that does not allow current to flow until a certain voltage is reached, and a constant current dead band generator that allows constant current to flow until a certain voltage is reached; and
- said noise absorber ensures that said control signal produced by said small-signal circuit is transferred to said power transistor, without being affected by said noise voltage if produced.

14. A power converter comprising:
- a power transistor;
- a small-signal circuit for driving said power transistor; and
- an interface circuit for allowing the control signal to be transferred to said power transistor from said small-signal circuit; wherein;
- said interface circuit comprises a noise absorber that electrically absorbs noise voltage produced between the ground of said small-signal circuit and that of said power transistor, by the stray inductance of said power transistor and a power module consisting of this power transistor;
- said noise absorber ensures that said control signal produced by said small-signal circuit is transferred to said power transistor, without being affected by said noise voltage if produced;
- said interface circuit further comprises a signal amplifier for converting the control signal outputted by said noise absorber, into the signal level for turning on or off said power transistor; and
- a difference between power voltage VDC of said interface circuit and logic voltage amplitude ΔVlogic of said signal amplifier (VDC−ΔVlogic) is set at a level higher than said noise voltage Vnoise.

15. A power converter comprising:
- a power transistor;
- a small-signal circuit for driving said power transistor; and
- an interface circuit for allowing the control signal to be transferred to said power transistor from said small-signal circuit; wherein;
- said interface circuit comprises a noise absorber that electrically absorbs noise voltage produced between the around of said small-signal circuit and that of said power transistor, by the stray inductance of said power transistor and a power module consisting of this power transistor;
- said noise absorber ensures that said control signal produced by said small-signal circuit is transferred to said power transistor, without being affected by said noise voltage if produced;
- a soft-switching gate-drive circuit for reducing the switching speed of said power transistor is arranged between said interface circuit and power transistor.

16. The power converter character according to claim 15, wherein said power transistor switching speed is set by said soft-switching gate-drive circuit in such a way that a value obtained by multiplying the inductance L of said stray inductance by a change of current I (dI/dt) flowing through said power transistor upon gradual switching of the power transistor by means of said soft-switching gate-drive circuit, does not exceed the difference between power voltage VDC of said interface circuit and logic voltage amplitude ΔVlogic of said signal amplifier (VDC−ΔVlogic).

17. An electric vehicle comprising:
- a wheel drive motor;
- a power converter for converting d.c. power supplied from a d.c. power source into a.c. power, and for controlling the current supplied to said motor;
- wherein said power converter comprises:
- a power transistor;
- a motor small-signal circuit for driving said power transistor; and
- an interface circuit for transferring control signals from this motor small-signal circuit to said power transistor;
- wherein said interface circuit comprises a noise absorber that electrically absorbs the noise voltage produced between the ground of said small-signal circuit and that of said power transistor, by the stray inductance of said power transistor and a power module consisting of this power transistor;

said electric vehicle further characterized in that said noise absorber ensures that said control signal produced by said small-signal circuit is transferred to said power transistor, without being affected by said noise voltage if produced.

* * * * *